(12) United States Patent
Kurnik et al.

(10) Patent No.: US 8,266,454 B2
(45) Date of Patent: Sep. 11, 2012

(54) SECURE FLASH MEMORY USING ERROR CORRECTING CODE CIRCUITRY

(75) Inventors: James T. Kurnik, Linden, MI (US); Ronald J. Gaynier, Ann Arbor, MI (US)

(73) Assignee: GM Global Technology Operations LLC

( * ) Notice: Subject to any disclaimer, the term of this patent is extended or adjusted under 35 U.S.C. 154(b) by 499 days.

(21) Appl. No.: 12/424,234

(22) Filed: Apr. 15, 2009

(65) Prior Publication Data

US 2010/0268988 A1  Oct. 21, 2010

(51) Int. Cl.
*G06F 11/30* (2006.01)
(52) U.S. Cl. .............................. 713/193; 714/23; 714/31
(58) Field of Classification Search .................. 713/193; 714/31, 763, 23, E11.024, E11.054
See application file for complete search history.

(56) References Cited

U.S. PATENT DOCUMENTS

| 4,694,454 A * | 9/1987 | Matsuura ...................... 714/6.1 |
| 6,772,289 B1 * | 8/2004 | Corrigan ...................... 711/118 |
| 7,403,204 B2 * | 7/2008 | Emerson et al. .............. 345/545 |
| 7,818,626 B1 * | 10/2010 | Tsien et al. ..................... 714/41 |
| 2007/0180186 A1 * | 8/2007 | Cornwell et al. ............. 711/103 |
| 2007/0180328 A1 * | 8/2007 | Cornwell et al. ............... 714/42 |
| 2009/0037780 A1 * | 2/2009 | Nakagaki et al. .............. 714/48 |
| 2010/0088558 A1 * | 4/2010 | Hishinuma et al. ........... 714/718 |

FOREIGN PATENT DOCUMENTS

JP  62210547 A  *  9/1987

* cited by examiner

*Primary Examiner* — Samson Lemma

(57) ABSTRACT

A processor and memory system includes memory, a table of exceptions, and a processor. The memory includes a plurality of memory blocks. The table of exceptions identifies at least one of the plurality of memory blocks that includes an expected error. The processor diagnoses a security fault based on data stored in at least one of the plurality of memory blocks and the table of exceptions.

12 Claims, 3 Drawing Sheets

SECURE FLASH MEMORY USING ERROR CORRECTING CODE CIRCUITRY

FIELD

The present disclosure relates to securing data in memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of a processor and memory system 10 is shown. A processor 100 executes a program that is stored in memory. For example only, the program may be stored in memory located in an instruction memory 102 (e.g. in nonvolatile memory 104), in the processor 100, and/or in random access memory (RAM) 106. For example only, the program may include instructions for the processor 100 to write or retrieve data from memory blocks 108-1, 108-2, . . . , 108-n, referred to collectively as memory blocks 108.

Memory blocks 108 contain data in the form of a bit array. The bit array is a data structure that stores individual bits. The individual bits may be retrieved by the processor 100. Further, the processor 100 may write data to the memory blocks 108 for later use. When the processor 100 is instructed to write to the memory blocks 108, the data is transmitted to an error correction code module (ECCM) 110.

The ECCM 110 detects and corrects errors in the memory blocks 108. When the ECCM 110 receives data from the processor 100 to write to the memory blocks 108, the ECCM 110 calculates a checksum. The checksum is an arithmetic sum of the bits stored in one of the respective memory blocks 108. For example, the checksum in memory block 108-1 is an arithmetic sum of the bits stored in memory block 108-1.

When the processor 100 is instructed to retrieve data from one of the memory blocks 108, the ECCM 110 retrieves the data from the one of the memory blocks 108 and detects whether an error exists in the data. If an error exists, then the ECCM 110 may correct the error by using the respective checksum. The data is then transmitted to the processor 100. If the error exists and is not correctable, then the ECCM 110 may indicate that an error has occurred.

An external device 112 may communicate with the processor 100. The external device 112 may receive data from or send data to the processor 100.

SUMMARY

A processor and memory system includes memory, a table of exceptions, and a processor. The memory includes a plurality of memory blocks. The table of exceptions identifies at least one of the plurality of memory blocks that includes an expected error. The processor diagnoses a security fault based on data stored in the at least one of the plurality of memory blocks and the table of exceptions.

In further features, the table of exceptions identifies the at least one of the plurality of memory blocks randomly. In other features, the at least one of the plurality of memory blocks is predetermined. In still other features, the processor takes remedial actions based on the diagnosis. In further features, the remedial action includes at least one of resetting the processor and halting operation.

In further features, the processor takes the remedial action when the memory does not include the expected error and is identified by the table of exceptions. In other features, the processor and memory system further includes an error correcting code module (ECCM) that notifies the processor of the expected error. In further features, the expected error is stored as an invalid checksum. In still further features, the ECCM notifies the processor when the expected error is accessed.

A data security method includes identifying at least one of a plurality of memory blocks that includes an expected error and diagnosing a security fault based on data stored in the at least one of the plurality of memory blocks and the identification.

In further features, the data security method further includes identifying the at least one of the plurality of memory blocks randomly. In other features, the at least one of the plurality of memory blocks is predetermined. In still other features, the data security method further includes taking remedial actions based on the diagnosis.

In further features, the remedial action includes at least one of resetting a processor and halting operation. In further features, the data security method further includes taking the remedial action when the at least one of the plurality of memory blocks does not include the expected error and is identified. In other features, the data security method further includes notifying a processor of the expected error.

In further features, the data security method further includes storing the expected error as an invalid checksum. In still further features, the data security method further includes notifying the processor when the expected error is accessed.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
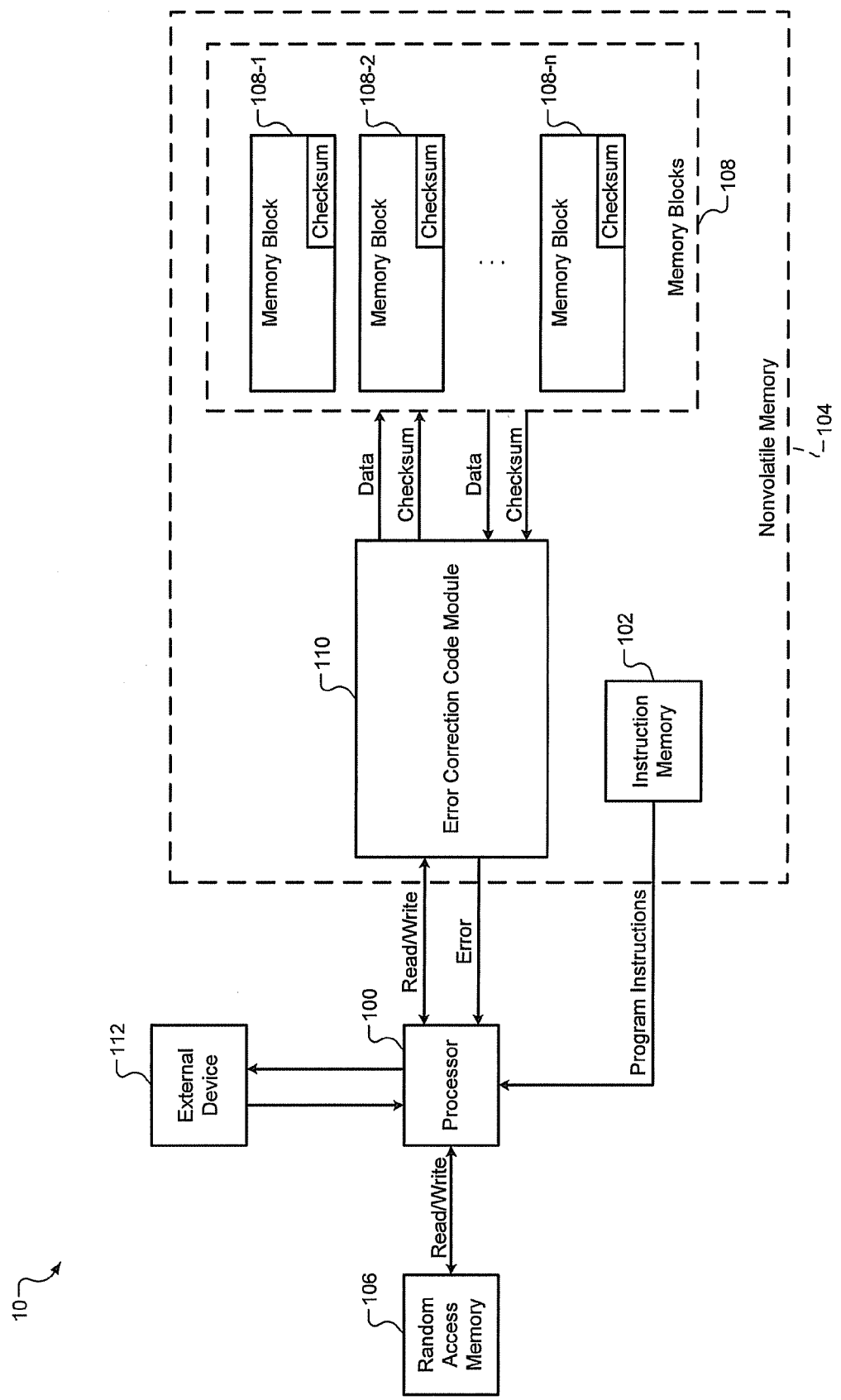
FIG. 1 is a functional block diagram of a processor and memory system 10 according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

A processor is designed to fetch and execute a program. The program may include instructions to access memory blocks that contain data. The data that is accessed by the processor may contain errors. Error correction code is used to detect and correct errors. Examples of error correction code include Hamming code, Golay code, Reed-Muller code, parity schemes, and repetition schemes. Detected errors may be corrected. If an error is not correctable, then the processor may be notified of the error.

According to the principles of the present disclosure, the error may be intentionally placed within a memory block. The program instructs the processor to read data from the memory block. When the program instructs the processor to read data from the memory block, the processor determines whether the error is present. If the error is present, then the processor will continue operating; otherwise, the processor will take remedial action.

Figure 2:
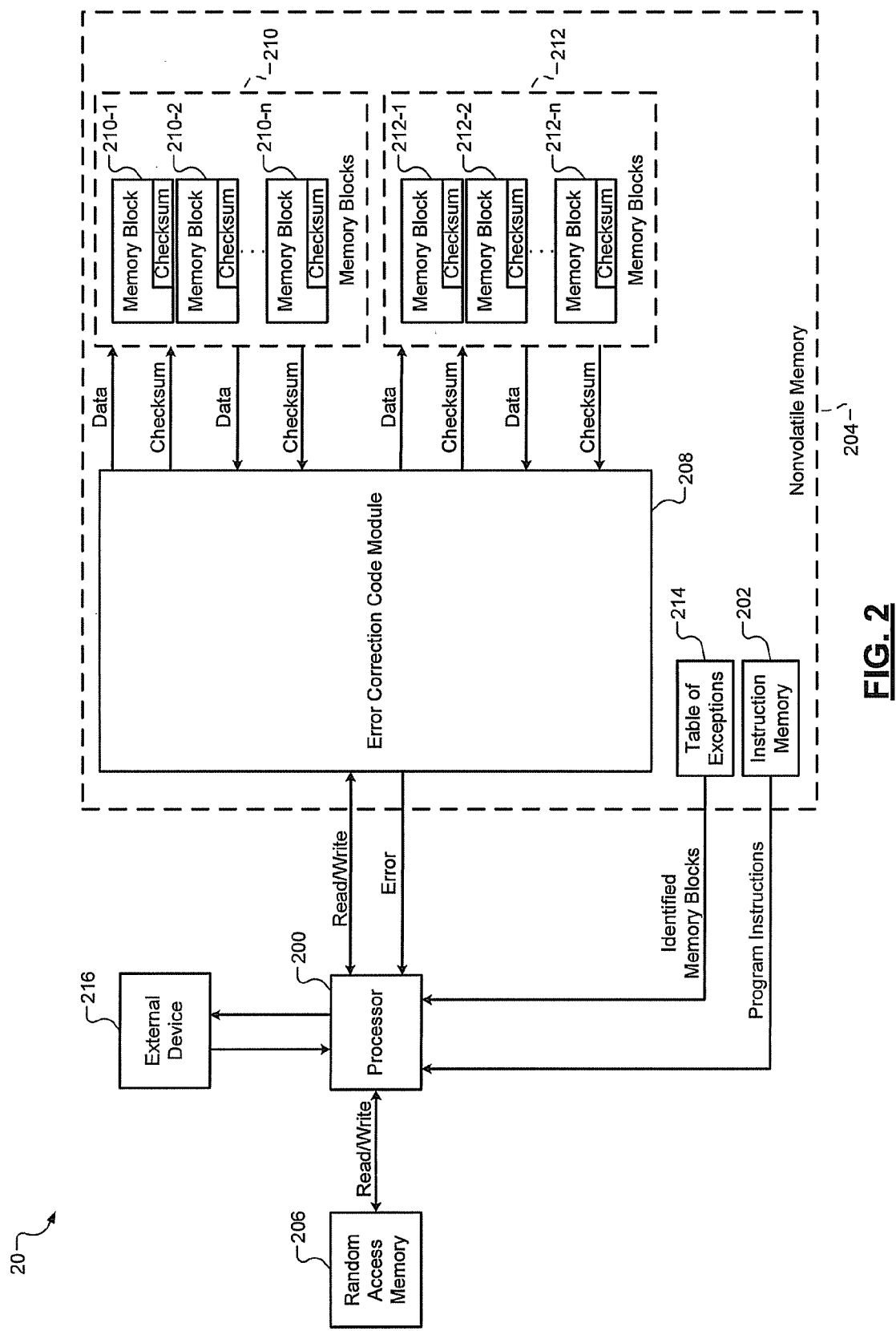
FIG. 2 is a functional block diagram of an exemplary processor and memory system 20 according to the principles of the present disclosure.

Referring now to FIG. 2, a functional block diagram of a processor and memory system 20 according to the principles of the present disclosure is shown. The processor and memory system 20 includes a processor 200, instruction memory 202, nonvolatile memory 204, RAM 206, an ECCM 208, memory blocks 210, and memory blocks 212.

The processor 200 executes a program. The program may include instructions for the processor 200 to write or retrieve data from memory blocks 210-1, 210-2, ..., 210-n, referred to collectively as memory blocks 210. The program may include instructions for the processor 200 to write or retrieve data from memory blocks 212-1, 212-2, ..., 212-n, referred to collectively as memory blocks 212. The memory blocks 210 and the memory blocks 212 store data. At least one of the memory blocks 210 and the memory blocks 212 may include an error. The ECCM 208 detects whether the error exists in the data. If the error exists, then the ECCM 208 may indicate that the error is detected and a security fault exists.

The processor 200 may diagnose the security fault. The program may instruct the processor 200 to access a table of exceptions 214. The table of exceptions 214 may identify at least one of the memory blocks 210 and the memory blocks 212 that includes the error. The identified memory block may be predetermined or determined randomly.

When the program instructs the processor 200 to retrieve data from the memory blocks 210 and the memory blocks 212, the processor 200 determines whether the memory block is identified in the table of exceptions 214. If the memory block is identified, then the processor 200 may expect the error. The error may be expected when the memory block which includes the error is identified in the table of exceptions 214. If the memory block is not identified, then the processor 200 may not expect the error. The processor 200 may take remedial actions based on the diagnosis. For example only, remedial actions may include resetting or halting operation.

If the processor 200 determines that the error is expected, then the processor 200 may anticipate receiving the error from the ECCM 208. For example, the processor 200 may set a flag indicating that the error is expected. If the processor 200 receives the error while the flag is set, then the processor 200 may continue operating. If the processor 200 does not receive the error while the flag is set, then the processor 200 may take remedial actions.

The processor 200 may not expect the error. The processor 200 may suspend setting the flag indicating that the error is expected. If the processor 200 receives the error while the flag is not set, then the processor 200 may take remedial actions. If the processor 200 does not receive the error, then the processor 200 may continue operating.

An external device 216 may communicate with the processor 200. The external device 216 may receive data from or send data to the processor 200. The external device 216 may instruct the processor 200 to retrieve data from or send data to the memory blocks 210 or memory blocks 212. The processor 200 may take remedial actions during the instruction. For example, the error may no longer exist because of an instruction to change the data and the processor 200 may expect the error based on the table of exceptions 214. Accordingly, the processor 200 may receive the error without setting the flag.

The external device 216 may not include instructions for the processor 200 to access the table of exceptions 214 or to anticipate the error based on the table of exceptions 214. The processor 200 may receive the error without setting the flag. Accordingly, the processor 200 may take remedial actions.

Figure 3:
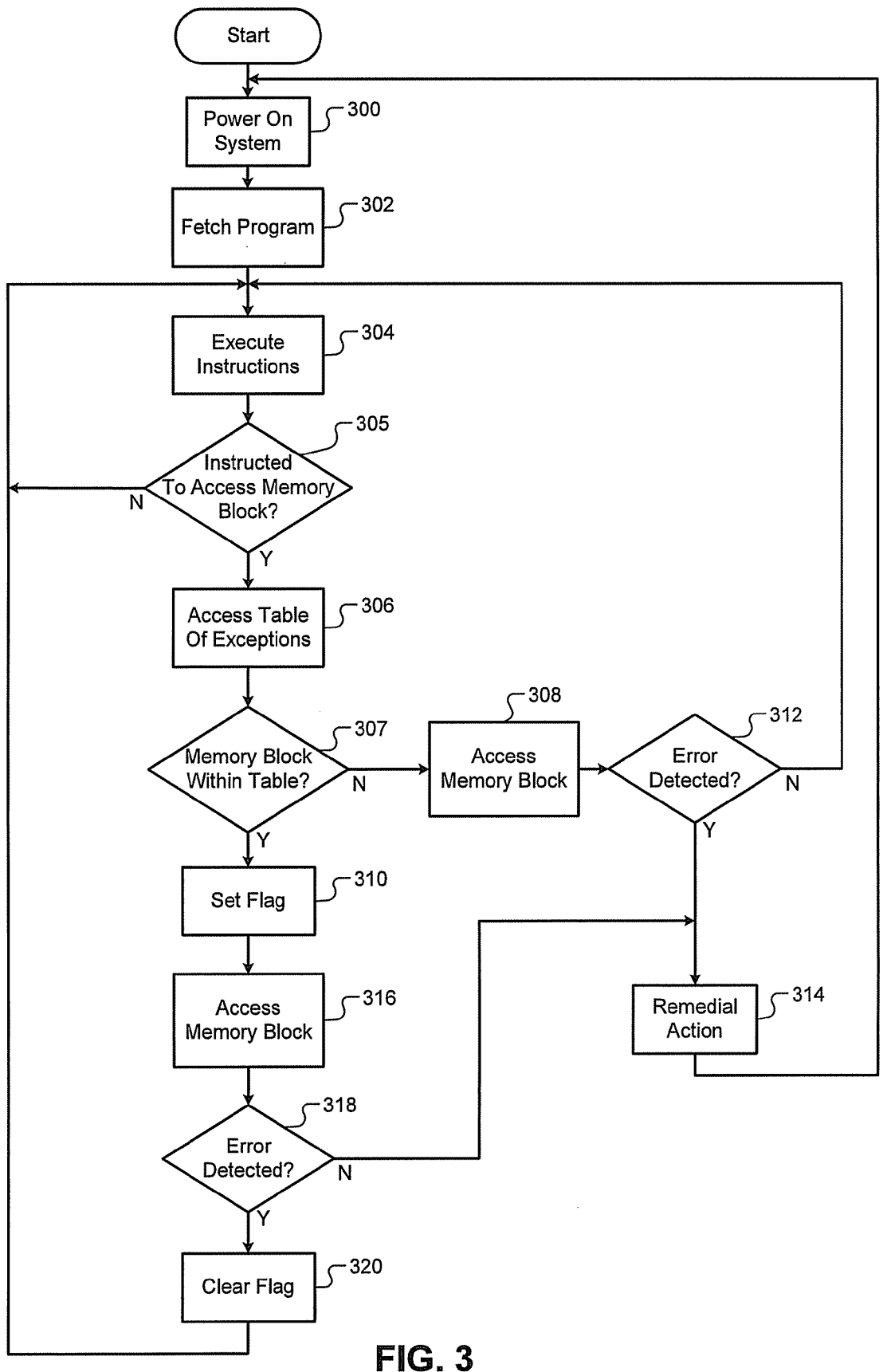
FIG. 3 is a flowchart that depicts exemplary steps of a data security method according to the principles of the present disclosure.

Referring now to FIG. 3, a flowchart depicts exemplary steps of a data security method according to the principles of the present disclosure. Control begins in step 300. In step 300, the processor and memory system is powered on. In step 302, control fetches the program. In step 304, control executes instructions from the program. In step 305, control determines whether the processor is instructed to access a memory block. If the processor is not instructed to access the memory block, then control returns to step 304; otherwise, control transfers to step 306.

In step 306, control accesses the table of exceptions. In step 307, control determines whether the processor is instructed to access a memory block listed in the table of exceptions. If the memory block is not listed in the table of exceptions, then control transfers to step 308; otherwise, control transfers to step 310.

In step 308, control accesses the memory block. In step 312, control determines whether the error is detected. If the error is detected, then control transfers to step 314; otherwise, control returns to step 304. In step 314, control takes remedial action. For example, the processor may halt operation or reset.

In step 310, control sets a flag. In step 316, control accesses the memory block. In step 318, control determines whether the error is detected. If the error is detected, then control transfers to step 320; otherwise, control transfers to step 314. In step 320, control clears the flag.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A processor and memory system comprising:
   memory that includes a plurality of memory blocks, at least one of said plurality of memory blocks including data that was intentionally stored and that is indicative of an error;
   an error correcting code module (ECCM) that executes error correcting code and that selectively indicates that an error exists in said data;
   a table of exceptions that identifies said at least one of said plurality of memory blocks that includes said data; and
   a processor that diagnoses a security fault based on whether said ECCM indicates that an error exists in said data and based on whether said at least one of said plurality of memory blocks is identified in said table of exceptions and that selectively takes remedial action when a security fault is diagnosed.

2. The processor and memory system of claim 1 wherein said table of exceptions identifies said at least one of said plurality of memory blocks randomly.

3. The processor and memory system of claim 1 wherein said at least one of said plurality of memory blocks is predetermined.

4. The processor and memory system of claim 1 wherein said remedial action includes at least one of resetting said processor and halting operation.

5. The processor and memory system of claim 1 wherein said processor diagnoses a security fault when said ECCM does not indicate that an error exists in said data and said at least one of said plurality of memory blocks is identified in said table of exceptions.

6. The processor and memory system of claim 1 wherein said data is stored as an invalid checksum.

7. A data security method comprising:
   intentionally storing data that is indicative of an error in at least one of a plurality of memory blocks;
   identifying, from a table of exceptions, said at least one of said plurality of memory blocks that includes said data that is indicative of an error;
   executing error correcting code;
   selectively indicating that an error exists in said data;
   diagnosing, using a processor, a security fault based on whether said at least one of said plurality of memory blocks is identified in said table of exceptions and based on whether existence of an error in said data is indicated; and
   selectively taking remedial action when a security fault is diagnosed.

8. The data security method of claim 7 further comprising identifying said at least one of said plurality of memory blocks randomly.

9. The data security method of claim 7 wherein said at least one of said plurality of memory blocks is predetermined.

10. The data security method of claim 7 wherein said remedial action includes at least one of resetting said processor and halting operation.

11. The data security method of claim 7 further comprising diagnosing a security fault when existence of an error in said data is not indicated and said at least one of said plurality of memory blocks is identified in said table of exceptions.

12. The data security method of claim 7 further comprising storing said data as an invalid checksum.

\* \* \* \* \*